(12) United States Patent
Mahon

(10) Patent No.: US 7,746,068 B2
(45) Date of Patent: Jun. 29, 2010

(54) METHOD AND APPARATUS FOR MEASURING CURRENT

(75) Inventor: James Stephen Mahon, Newton-le-Willows (GB)

(73) Assignee: Lem Heme Limited, Skelmersdale, Lancashire (GB)

( * ) Notice: Subject to any disclaimer, the term of this patent is extended or adjusted under 35 U.S.C. 154(b) by 447 days.

(21) Appl. No.: 11/569,550

(22) PCT Filed: May 25, 2005

(86) PCT No.: PCT/GB2005/002099

§ 371 (c)(1),
(2), (4) Date: Apr. 23, 2007

(87) PCT Pub. No.: WO2005/119274

PCT Pub. Date: Dec. 15, 2005

(65) Prior Publication Data

US 2007/0290695 A1     Dec. 20, 2007

(30) Foreign Application Priority Data

May 29, 2004  (GB)  ................. 0412129.9

(51) Int. Cl.
  *G01R 33/00* (2006.01)
(52) U.S. Cl. .................. 324/225; 324/158.1
(58) Field of Classification Search ............ 324/158.1, 324/754–765; 336/223–225; 438/769, 782
  See application file for complete search history.

(56) References Cited

U.S. PATENT DOCUMENTS

| | | | |
|---|---|---|---|
| 3,626,291 A | 12/1971 | Yauch et al. | |
| 4,835,524 A | * 5/1989 | Lamond et al. | 340/572.3 |
| 4,876,555 A | * 10/1989 | Jorgensen | 343/895 |
| 6,018,239 A | * 1/2000 | Berkcan et al. | 324/127 |
| 6,885,183 B2 | * 4/2005 | Kato | 324/117 R |

(Continued)

FOREIGN PATENT DOCUMENTS

EP    0 156 659    10/1985

(Continued)

OTHER PUBLICATIONS

International Search Report for PCT Application No. PCT/GB2005/002099 mailed on Nov. 8, 2005.

(Continued)

*Primary Examiner*—Minh N Tang
*Assistant Examiner*—Trung Q Nguyen
(74) *Attorney, Agent, or Firm*—James B. Conte; HBSWK

(57) ABSTRACT

Current testing/measuring apparatus 10 comprises a flexible member 12 having a first end 14 and a second end 16. In use, the flexible member 12 is arranged to locate around a conductor 11 carrying a current to be measured. In particular, the current measuring apparatus 10 comprises a Rogowski coil. The ends of the flexible member 12 are coupled together in use but a gap is created between the ends. This distance can generate errors in the current measurement and the present invention provides compensation means 28 in the form of a compensation windings. The compensation windings comprise a planar spiral conductor provided on a printed circuit board to compensate for the separation distance between the first end and the second end.

21 Claims, 2 Drawing Sheets

U.S. PATENT DOCUMENTS 7,106,162 B2 * 9/2006 Saito .......................... 336/229
7,397,234 B2 * 7/2008 Alfano et al. ............... 324/126

FOREIGN PATENT DOCUMENTS

| GB | 2 332 784 | 6/1999 |
| GB | 2 342 783 | 4/2000 |
| WO | WO 87/01812 | 3/1987 |

OTHER PUBLICATIONS

Written Opinion of the International Searching Authority for PCT/GB2005/002099 mailed on Nov. 8, 2005.

* cited by examiner

METHOD AND APPARATUS FOR MEASURING CURRENT

The Present application claims priority from PCT/GB2005/002099 filed May 25, 2005, which claims priority from GB 0417129.9 filed May 29, 2004.

FIELD OF THE INVENTION

The present invention relates to compensation means for current measuring apparatus, current measuring apparatus comprising compensation means, a method of compensating current measuring apparatus and a method of measuring current in a conductor.

BACKGROUND TO THE INVENTION

Current measuring apparatus include a uniform coil of wire which is wound on a non-magnetic former of constant cross-section area and shaped into a closed loop. Such current measuring apparatus is termed a Rogowski coil which is based on the Rogowski principle. The Rogowski coil comprises a flexible open ended member which is formed into a contiguous loop around a conductor in order to measure the electric current and associated parameters of the conductor.

In use, the flexible member is located around a conductor in order for a first end of the flexible member to locate adjacent to and be coupled with a second end of the flexible member. Accordingly, the flexible member forms a "closed" loop or a contiguous loop around the conductor carrying the current to be measured. However, since there must be a physical gap between the wire of the coil in the first end and second end of the flexible member the Rogowski coil does not physically re-create the theoretical closed loop of the theoretical Rogowski principle.

It is an aim of the present invention to overcome at least one problem associated with the prior art whether referred to herein or otherwise.

SUMMARY OF THE INVENTION

According to a first aspect of the present invention there is provided compensation means for current measuring apparatus wherein the compensation means comprises a conductor in which the conductor is arranged to wind around a fixed point and wherein the distance from a first point on the conductor to the fixed point is greater than the distance from a second point on the conductor to the fixed point.

Preferably the conductor of the compensation means and the fixed point all lie within the same plane.

Preferably, the compensation means is planar. Preferably the compensation means comprises a planar spiral conductor.

Preferably the distance between the fixed point and the conductor increases along the conductor and more preferably increases in order for the conductor to form a spiral around the fixed point.

Preferably the fixed point is arranged, in use, to locate on or be coincidental with the longitudinal axis of a central conductor of the current measuring apparatus.

Preferably the fixed point is arranged, in use, to locate on or be coincidental with the centre of an outer coil of the current measuring apparatus.

The fixed point may comprise a fixed axis.

Preferably the conductor comprises at least a first curved section and a second curved section and wherein the radius of curvature of the second curved section is less than the radius of curvature of the first curved section.

Preferably the compensation means comprises a spiral compensation means. The conductor may comprise a spiral winding formed from a conductor.

Preferably the compensation means comprises a planar spiral.

Preferably the current measuring apparatus comprise an outer coil located around a central conductor and more preferably comprises a Rogowski coil.

Preferably the current measuring apparatus comprises flexible current measuring apparatus.

Preferably the current measuring apparatus comprises a flexible member having a first end and a second end, in which, in use, the first end is arranged to locate adjacent to the second end. The first end may be spaced from the second end, in use. Preferably, the compensation means is arranged, in use, to locate between the first end and the second end. Preferably the compensation means is arranged to compensate for the separation distance of the first end and the second end, in use. Preferably the current measuring apparatus forms a loop around a conductor, in use. Preferably the current measuring apparatus forms a contiguous loop around a conductor, in use.

Preferably the current measuring apparatus comprises a central conductor and an outer coil located therearound. Preferably the central conductor is in electrical communication with the outer coil.

Preferably the compensation means locates adjacent to the first end of the flexible member (of the current measuring apparatus).

Preferably the compensation means locates between a central conductor and an outer coil of the current measuring apparatus.

Preferably the compensation means comprises a section of a conductor that is in electrical communication with the outer coil of the current measuring apparatus.

Preferably the compensation means comprises a spiral section of a conductor which is preferably arranged, in use, to spiral around a longitudinal axis of a central conductor of current measurement apparatus.

Preferably the section of the conductor comprises a section of copper. Preferably the compensation means is provided on a printed circuit board. Preferably the compensation means comprise a conductor on a printed circuit board and more preferably a spiral conductor on a planar printed circuit board.

Preferably the compensation means is arranged, in use, to locate between the Rogowski coil and calculation means for calculating the current measured by the current measuring apparatus.

The compensation means may locate between a first end of a flexible member of the current measuring apparatus and a second end of the flexible member of the current measuring apparatus.

According to a second aspect of the present invention there is provided current measuring apparatus including compensation means, the current measuring apparatus comprising a coil of a conductor, the compensation means comprising a conductor in which the conductor is arranged to wind around a fixed point and wherein the distance from a first point on the conductor to the fixed point is greater than the distance from a second point on the conductor to the fixed point.

Preferably, the conductor comprises at least a first curved section and a second curved section and wherein the radius of curvature of the second curved section is less than the radius of curvature of the first curved section.

Preferably the current measuring apparatus comprises a Rogowski coil.

According to a third aspect of the present invention there is provided a method of compensating current measuring apparatus comprising providing a conductor in which the conductor is arranged to wind around a fixed point and wherein the distance from a first point on the conductor to the fixed point is greater than the distance from a second point on the conductor to the fixed point.

Preferably, the conductor comprises at least a first curved section and a second curved section and wherein the radius of curvature of the second curved section is less that the radius of curvature of the first curved section.

According to a fourth aspect of the present invention there is provided a method of measuring current in a conductor comprising locating a flexible member of current measuring apparatus around the conductor, wherein the current measuring apparatus comprises compensation means in accordance with the first aspect of the present invention.

BRIEF DESCRIPTION OF THE DRAWINGS

The preferred embodiment of the present invention will now be described, by way of example only, with reference to the drawings that follow, in which.

DESCRIPTION OF THE PREFERRED EMBODIMENT

Figure 1:
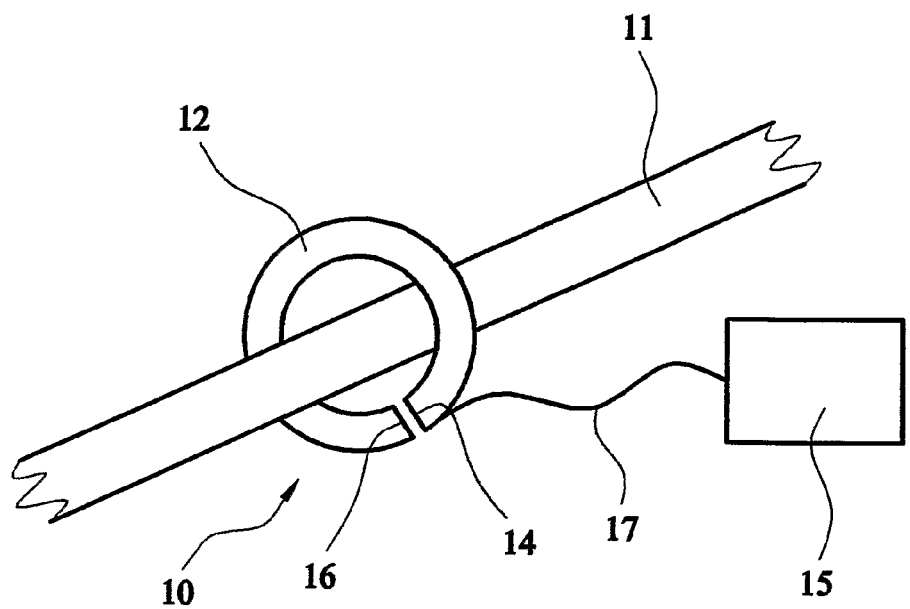
FIG. 1 is a perspective view of an embodiment of current measuring apparatus located around a conductor carrying a current to be measured.

As shown in FIG. 1, current testing/measuring apparatus comprises a flexible member 12 having a first end 14 and a second end 16. The current measuring apparatus 10 co-operates with calculation means 15 through a cable 17 in order for the calculation means to calculate the current in the conductor 11 from the signal obtained from the current measuring apparatus 10. In use, the flexible member 12 is arranged to locate around a conductor 11 carrying a current to be measured. The first end 14 of the flexible member 12 is arranged, in use, to locate adjacent to the second end 16 of the flexible member in order for the flexible member 12 to form a contiguous loop.

Figure 2:
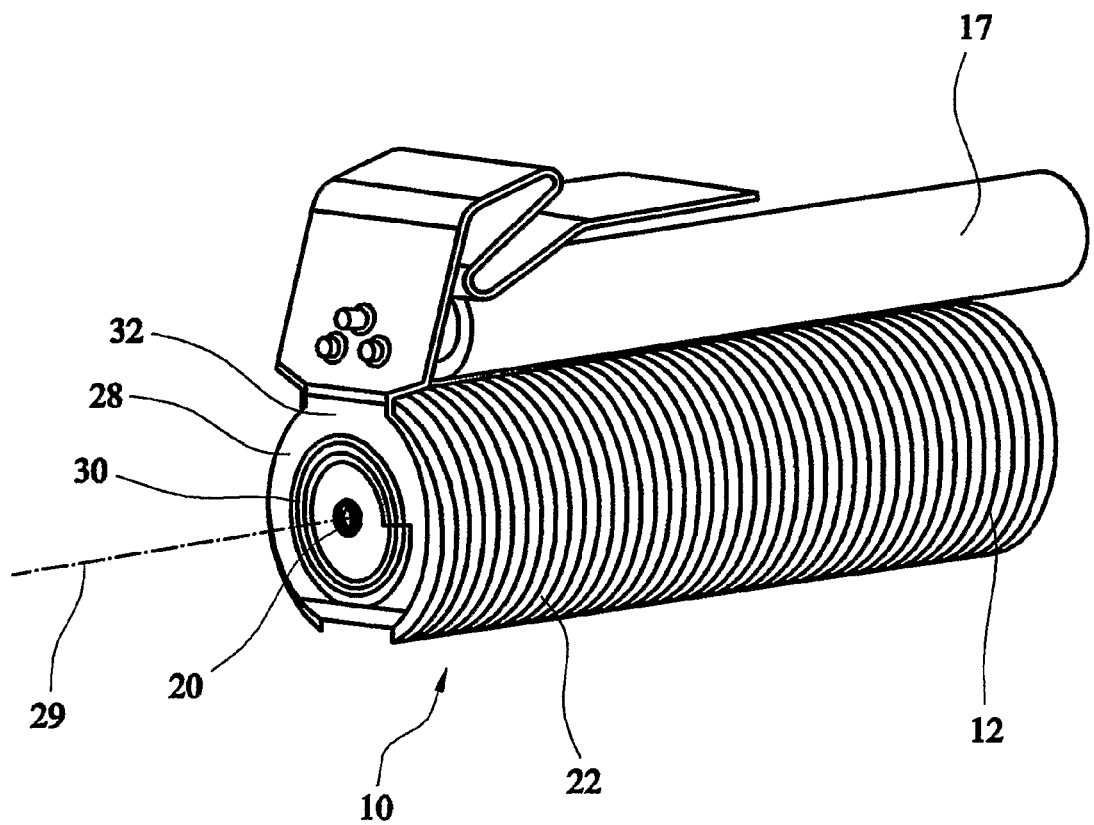
FIG. 2 is a perspective view of an end of a flexible member of current measuring apparatus comprising a preferred embodiment of compensation means.
Figure 3:
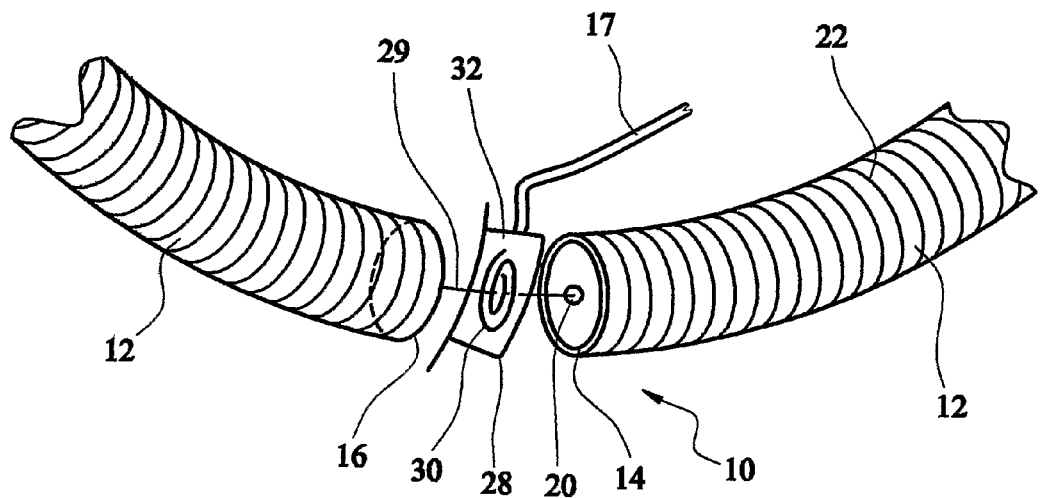
FIG. 3 is an exploded view of a first end and a second end of a flexible member of current measuring apparatus comprising a preferred embodiment of compensation means located therebetween.

As shown in FIG. 2 and FIG. 3, the current measuring apparatus 10 comprises a Rogowski coil which includes a central conductor 20 and an outer coil 22 of wire or other conducting material. The Rogowski principle states that if a uniform coil is wound on a non-magnetic former of constant cross-sectional area and shaped into a closed loop, then the voltage induced in the coil is directly proportional to the rate of change of current passing through the loop. The flexible member 12 is arranged to be clamped (or unclamped) or otherwise coupled around the conductor 11 carrying the current to be measured.

The current measuring apparatus 10 includes coupling means (not shown) which enables the first end 14 of the flexible member 12 to be coupled to the second end 16 of the flexible member 12. However, the coupling creates a gap or separation distance (or spacing) between the first end 14 of the flexible member 12 and the second end 16 of the flexible member 12. Accordingly, the flexible member 12 of the Rogowski coil does not create a completely closed loop.

This separation distance can generate errors in the measurement of the primary current and, therefore, to allow for this separation distance (or gap) compensation means 28 are used. The compensation means 28 comprises a compensation winding(s) which effectively compensates for the winding(s) of the outer coil 22 of the Rogowski coil which are not present due to the flexible member 12 not creating a theoretical closed loop around the conductor 11. The number of compensation windings used with a Rogowski coil relates directly to the size of the gap and the number of turns that theoretically would have been on the outer coil 22 of the Rogowski coil if there was no separation distance between the ends 14, 16 of the flexible member (i.e. a theoretical closed loop).

Figure 4:
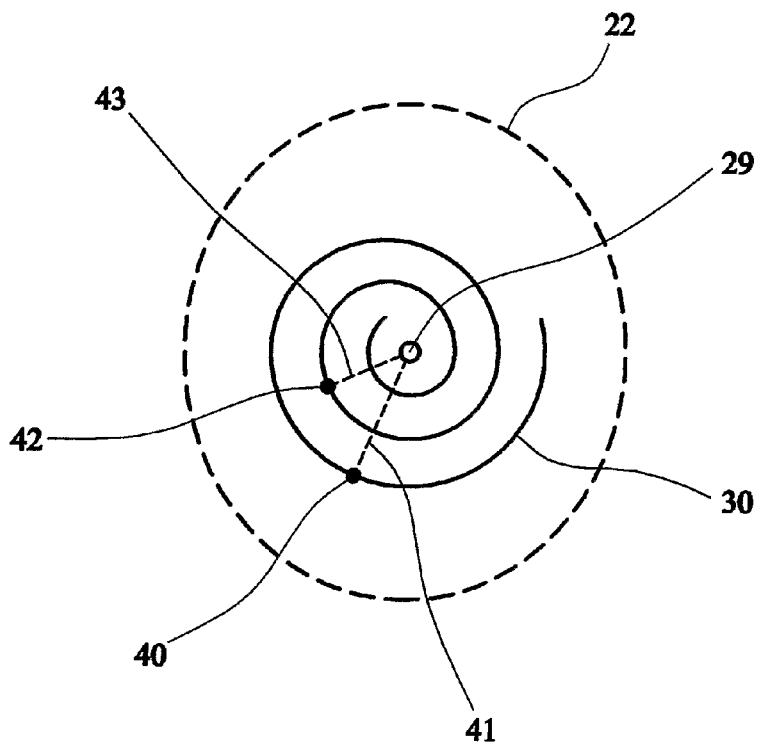
FIG. 4 is a schematic view of a preferred embodiment of a conductor of compensation means.

As shown in FIG. 1, FIG. 3 and FIG. 4, the windings of the compensation means 28 for the present invention wind around a fixed point or axis 29 and wherein the distance 41 from a first point 40 on the conductor to the fixed point or axis 29 is greater than the distance 43 from a second point 42 on the conductor to the fixed point or axis 29. The fixed point is on the longitudinal axis 29 of the central conductor 20 of the Rogowski coil. Accordingly, the fixed point 29 also coincides with the centre of the outer coils 22 forming the Rogowski coil. Accordingly, the winding 30 in the compensation means 28 are effectively coincident with the coils 22 in the outer coil 22 of the Rogowski coil. The spiral winding is planar.

The conductor of the compensation means 28 comprises at least a first curved or arcuate portion and a second curved or arcuate portion in which the radius of curvature of the second arcuate position is less than the radius of curvature of the first curved or arcuate portion. In particular, the compensation windings comprise a spiral conductor 30 or helix such that the radius of curvature of the conductor section gradually decreases from an outer section to an inner section. The number of turns in the winding depends upon the separation distance, as previously explained.

The compensation means comprises a planar copper spiral provided on a printed circuit board and the compensation means 28 locates between the ends 14, 16 of the flexible member of the Rogowski coil.

The spiral winding 30 effectively comprises concentric turns or winding in order to form a planar winding, i.e. in use, the turns or spiral winding are all in substantially the same, plane and have an axis which is coincidental with the longitudinal axis 29 of the central conductor 20 of the Rogowski coil. In particular, the radius or distance from the longitudinal axis of the central conductor of the Rogowski coil to the compensation winding(s) increases gradually radially outwardly in order to create a spiral winding 30.

In the preferred embodiment, as shown in FIG. 2, FIG. 3 and FIG. 4 the spiral winding 30 effectively locates between the central conductor 20 and the outer coil 22 of the Rogowski coil.

The spiral compensation winding 30 is provided on a circuit board 32 which locates between the first end 14 and the second end 16 of the flexible member 12, in use. The spiral winding 30 comprise a copper strip provided on the circuit board 32. As can be seen the winding is entirely curvilinear and continuous.

Prior art compensation means may include windings forming a cylindrical sleeve which locate over the outer coil of the Rogowski coil and form a cylindrical coil section over a part of an end of the Rogowski coil. This can result in the Rogowski coil or at least one end thereof becoming relatively bulky. The present invention is planar (and is provided on a planar circuit board) and is very thin this and locates between an end of the Rogowski coil and an end cap. Furthermore, the compensation means and, in particular the circuit board including the compensation winding may be flexible and/or resilient.

The spiral compensation winding 30 of the present invention is provided on a circuit board 32 which is quicker to form compared to prior art cylindrical compensation windings and this thereby reduces the cost of the compensation means 28 of the present invention.

Again, since the compensation spiral winding 30 is provided on a circuit board 32, there are less production processes involved in the present invention compared to prior art compensation windings and, therefore, the compensation means of the present invention takes less time to build and, therefore, greater quantities of the present invention can be formed compared to prior art devices. In addition, since less processes are involved, there is less chance of the apparatus being incorrectly formed and therefore the apparatus will be more reliable and accurate compared to prior art devices. Furthermore, in prior art compensation means, a production operative must count exactly the number of turns required and miscounting can occur and this can lead to inaccuracies. Finally, the present invention relates to a spiral winding circuit which is repeatable for production purposes and the accuracy and the overall quality of the apparatus is greater than prior art cylindrical windings.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims, abstract and drawings), or to any novel one, or any novel combination, of the steps of any method or process so disclosed.

The invention claimed is:

1. Compensation means for current measuring apparatus wherein the compensation means comprises a conductor in which the conductor is arranged to wind around a fixed point wherein the distance from a first point on the conductor to the fixed point is greater than the distance from a second point on the conductor to the fixed point and wherein the current measuring apparatus comprises a flexible member having a first end and a second end, in which, in use, the first end is arranged to locate adjacent to the second end.

2. Compensation means according to claim 1 in which the conductor of the compensation means and the fixed point all lie within the same plane.

3. Compensation means according to claim 1 in which the compensation means is planar.

4. Compensation means according to claim 1 in which the compensation means comprises a planar spiral conductor.

5. Compensation means according to claim 1 in which the distance between the fixed point and the conductor increases along the conductor.

6. Compensation means according to claim 1 in which the distance between the fixed point and the conductor increases in order for the conductor to form a spiral around the fixed point.

7. Compensation means according to claim 1 in which the fixed point is arranged, in use, to locate on or be coincidental with the longitudinal axis of a central conductor of the current measuring apparatus.

8. Compensation means according to claim 1 in which the fixed point is arranged, in use, to locate on or be coincidental with the centre of an outer coil of the current measuring apparatus.

9. Compensation means according to claim 1 in which the conductor comprises at least a first curved section and a second curved section and wherein the radius of curvature of the second curved section is less than the radius of curvature of the first curved section.

10. Compensation means according to claim 1 in which the compensation means comprises a spiral compensation means.

11. Compensation means according to claim 1 in which the conductor comprises a spiral winding formed from a conductor.

12. Compensation means according to claim 1 in which the current measuring apparatus comprise an outer coil located around a central conductor.

13. Compensation means according to claim 1 in which the current measuring apparatus comprises a Rogowski coil.

14. Compensation means according to claim 1 in which the first end is spaced from the second end, in use.

15. Compensation means according to claim 14 in which the compensation means is arranged, in use, to locate between the first end and the second end.

16. Compensation means according to claim 15 when dependent upon claim 15 in which the compensation means is arranged to compensate for the separation distance of the first end and the second end, in use.

17. Compensation means according to claim 1 in which the current measuring apparatus forms a loop around a conductor, in use.

18. Compensation means according to claim 1 in which the current measuring apparatus forms a contiguous loop around a conductor, in use.

19. Compensation means according to claim 1 in which the compensation means locates between a central conductor and an outer coil of the current measuring apparatus.

20. Compensation means according to claim 1 in which the compensation means comprises a spiral section of a conductor which is arranged, in use, to spiral around a longitudinal axis of a central conductor of current measurement apparatus.

21. Compensation means according to claim 1 in which the compensation means is arranged, in use, to located between Rogowski coil and calculation means for calculating the current measured by the current measuring apparatus.

* * * * *